(12) United States Patent
Noda (10) Patent No.: US 7,167,938 B2
(45) Date of Patent: Jan. 23, 2007

(54) DATA TRANSFER MEMORY

(75) Inventor: Atsushi Noda, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 125 days.

(21) Appl. No.: 11/068,601

(22) Filed: Feb. 28, 2005

(65) Prior Publication Data

US 2005/0198419 A1    Sep. 8, 2005

(30) Foreign Application Priority Data

Mar. 2, 2004  (JP) .............................. 2004-057903

(51) Int. Cl.
 G06F 13/00 (2006.01)
 G06F 1/04 (2006.01)
(52) U.S. Cl. .................. 710/110; 713/400; 710/305
(58) Field of Classification Search ............... None
See application file for complete search history.

(56) References Cited

U.S. PATENT DOCUMENTS

2004/0139258 A1* 7/2004 Chambers ................... 710/110
2005/0005049 A1* 1/2005 Montalvo et al. ........... 710/110

* cited by examiner

Primary Examiner—Glenn A. Auve
(74) Attorney, Agent, or Firm—Fish & Richardson P.C.

(57) ABSTRACT

A data transfer memory for reducing the number of components in an electronic module. A master controller circuit provides a transfer start command to a master clock signal generator circuit when receiving an activation detection signal from a power activation detection circuit. As a result, the master clock signal generator circuit generates a basic clock signal, outputs the basic clock signal to an SCL line, and has a master transfer sequencer circuit execute a transfer sequence. The master transfer sequencer circuit transmits a start condition, data stored in the nonvolatile memory via a serial control circuit, and a stop condition to an SDA line synchronously with the basic clock signal.

7 Claims, 8 Drawing Sheets

| Nonvolatile Memory Address | Storage Data |
|---|---|
| 0 | Slave Address (1) |
| 1 | Word Address (1) |
| 2 | Transfer Data (1) |
| 3 | Slave Address (2) |
| 4 | Word Address (2) |
| 5 | Transfer Data (2) |
| 6 | Slave Address (3) |
| 7 | Word Address (3) |
| 8 | Transfer Data (3) |
| ⋮ | ⋮ |
| 3Z-3 | Slave Address (Z) |
| 3Z-2 | Word Address (Z) |
| 3Z-1 | Transfer Data (Z) |

| Nonvolatile Memory Address | Storage Data |
|---|---|
| 0 | Slave Address (1) |
| 1 | Word Address (1) |
| 2 | Transfer Data (1-1) |
| 3 | Transfer Data (1-2) |
| ⋮ | ⋮ |
| X+1 | Transfer Data (1-X) |
| X+2 | Slave Address (2) |
| X+3 | Word Address (2) |
| X+4 | Transfer Data (2-1) |
| X+5 | Transfer Data (2-2) |
| ⋮ | ⋮ |
| 2X+3 | Transfer Data (2-X) |
| ⋮ | ⋮ |
| (Z-1) × (X+2) | Slave Address (Z) |
| (Z-1) × (X+2) +1 | Word Address (Z) |
| (Z-1) × (X+2) +2 | Transfer Data (Z-1) |
| (Z-1) × (X+2) +3 | Transfer Data (Z-2) |
| ⋮ | ⋮ |
| (Z-1) × (X+2) -1 | Transfer Data (Z-X) |

DATA TRANSFER MEMORY

CROSS-REFERENCE TO RELATED APPLICATIONS

This application is based upon and claims the benefit of priority from prior Japanese Patent Application No. 2004-057903, filed on Mar. 2, 2004, the entire contents of which are incorporated herein by reference.

BACKGROUND OF THE INENTION

The present invention relates to a data transfer memory.

Philips Electronics has proposed an I2C (Inter-Integrated Circuit) bus, that is a two-wire serial bus. The I2C bus is used for operating a slave device in response to a transmission command issued by a master device. Operation of the I2C bus is described with reference to FIGS. 1 to 5.

Figure 1:
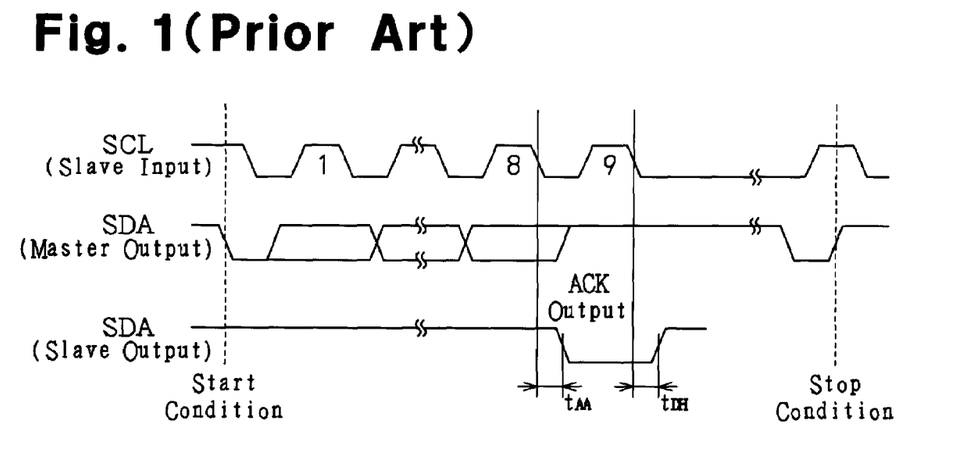
FIG. 1 is an operational timing chart of an I2C bus.

As shown in FIG. 1, under a start condition, a serial clock line (SCL line) is at an H level while a serial data line (SDA line) shifts from an H level to an L level. All operations initiate from the start condition. Under a stop condition, the SCL line is at an H level while the SDA line shifts from an L level to an H level. The SCL line is a line into which a serial clock signal is input. The SDA line is a line used for data transfer.

A transmission command is issued by shifting the level of the SDA line when the SCL line is at an L level. The transmission command is a signal including eight consecutively transmitted bits. During a ninth clock cycle, a slave device receiving the command shifts the SDA line to an L level and outputs an acknowledgement indicating that it has received the command. In this manner, each command is issued and received in a unit of nine clock cycles.

Figure 2:
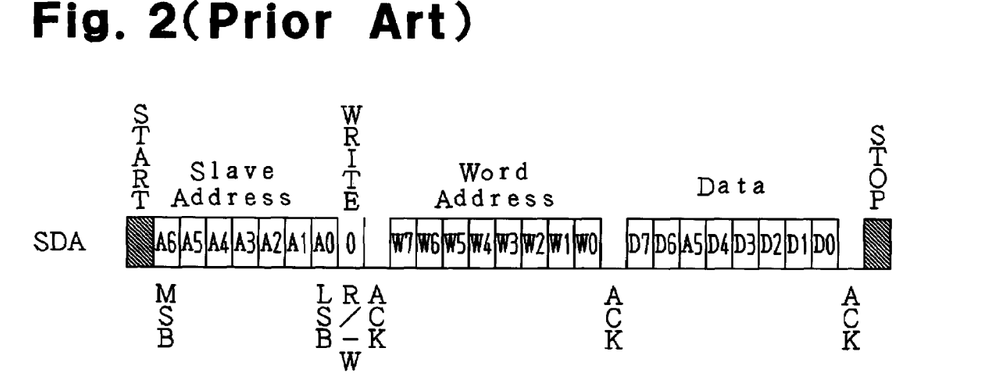
FIG. 2 shows a byte write sequence of the I2C bus.

FIG. 2 shows a byte write sequence in which data is written to a slave device in byte units by a master device. First, the master device transmits a start condition (START). The master device then transmits a slave address in seven clock cycles to select one of a plurality of slave devices for writing data. The master device further transmits an L level write command code (WRITE) during the eighth clock cycle. The selected slave device outputs an acknowledgement (ACK) when recognizing that it has been selected.

Upon receiving the acknowledgement, the master device transmits an 8-bit write address (word address) to the slave device. The slave device, recognizing the write address, outputs an acknowledgement (ACK). Upon receiving this acknowledgement, the master device further transmits 8-bit write data. When recognizing the write data, the slave device outputs an acknowledgement. Upon receiving the last acknowledgement, the master device transmits a stop condition (STOP). Upon recognizing the stop condition, the slave device starts writing the data.

Figure 3:
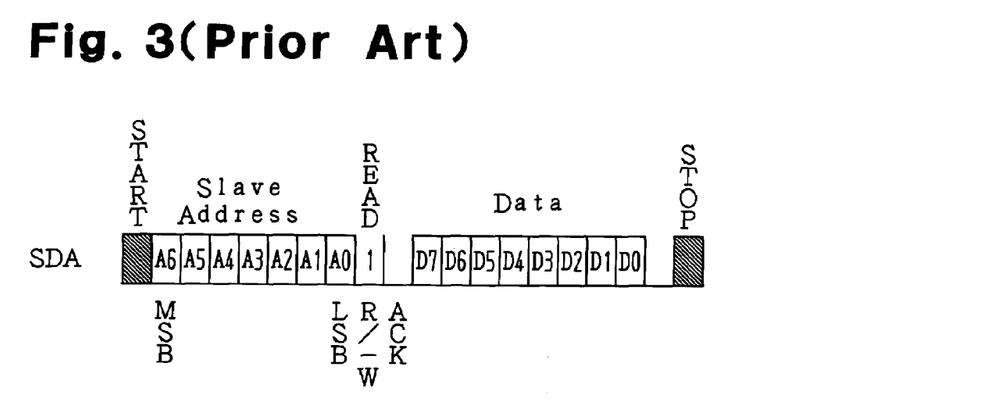
FIG. 3 shows a current address read sequence of the I2C bus.

FIG. 3 shows a current address read sequence in which a master device reads data in byte units from a slave device. First, the master device transmits a start condition (START). Subsequently, the master device transmits a slave address in seven clock cycles to select one of a plurality of slave devices from which data is to be read. The master device then transmits an H level command code (READ) during the eighth clock cycle. The slave device transmits an acknowledgement when recognizing that it has been selected.

After outputting the acknowledgement, the slave device outputs 8 bits of read data at the current address held by the slave device. Thereafter, the master device transmits a stop condition (STOP) without outputting an acknowledgement. This ends the-read operation of the slave device.

Figure 4:
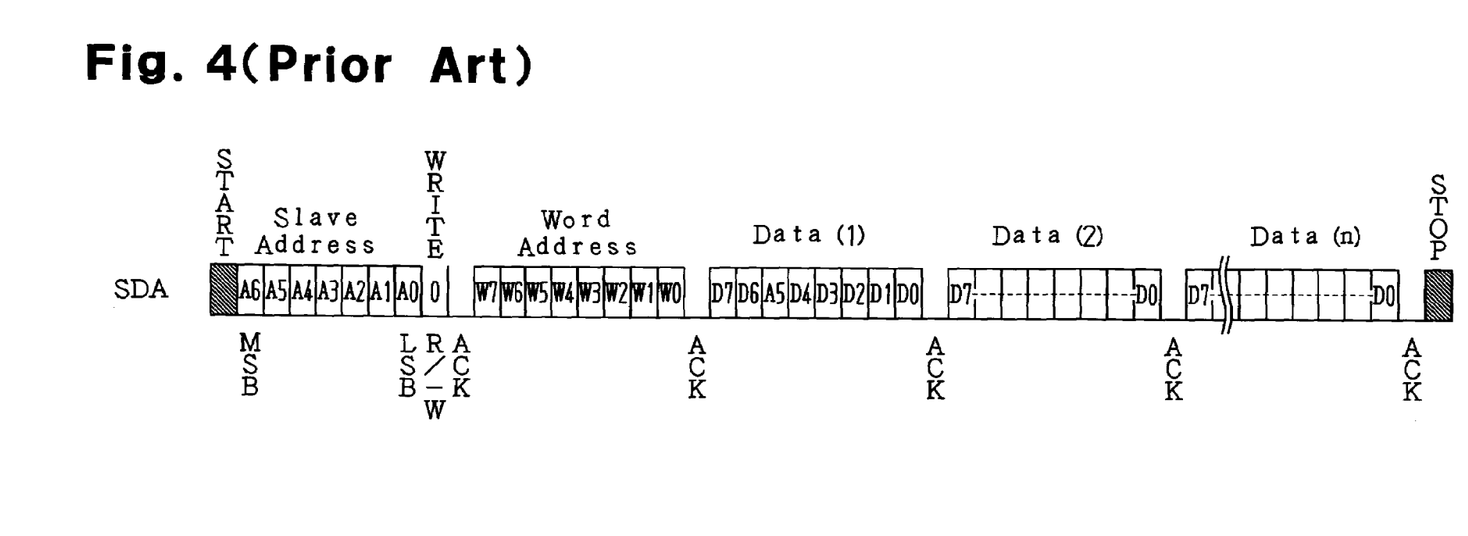
FIG. 4 is a diagram illustrating a page write sequence on the I2C bus.

FIG. 4 shows a page write sequence in which data is written from a master device to a slave device in page units. First, the master device transmits a start condition. Then, the master device transmits a slave address in seven clock cycles to select one of a plurality of slave devices for writing data. The master device then transmits an L level write command code during the eighth clock cycle. The selected slave device outputs an acknowledgement when recognizing that it has been selected.

Upon receiving this acknowledgement, the master device outputs an 8-bit write address to the slave device. When recognizing the write address, the slave device outputs an acknowledgement. Upon receipt of this acknowledgement, the master device further transmits 8-bit write data (1). The slave device, recognizing the write data, outputs an acknowledgement. The master device then transmits 8-bit write data (2) corresponding to the next word address, and the slave device outputs an acknowledgement. Subsequently, the transmission of 8-bit write data from the master device and the output of an acknowledgement from the slave device are repeated to transmit a maximum page size of write data to the slave device. When the master device finally transmits a stop condition, the slave device starts writing the page size of data.

Figure 5:
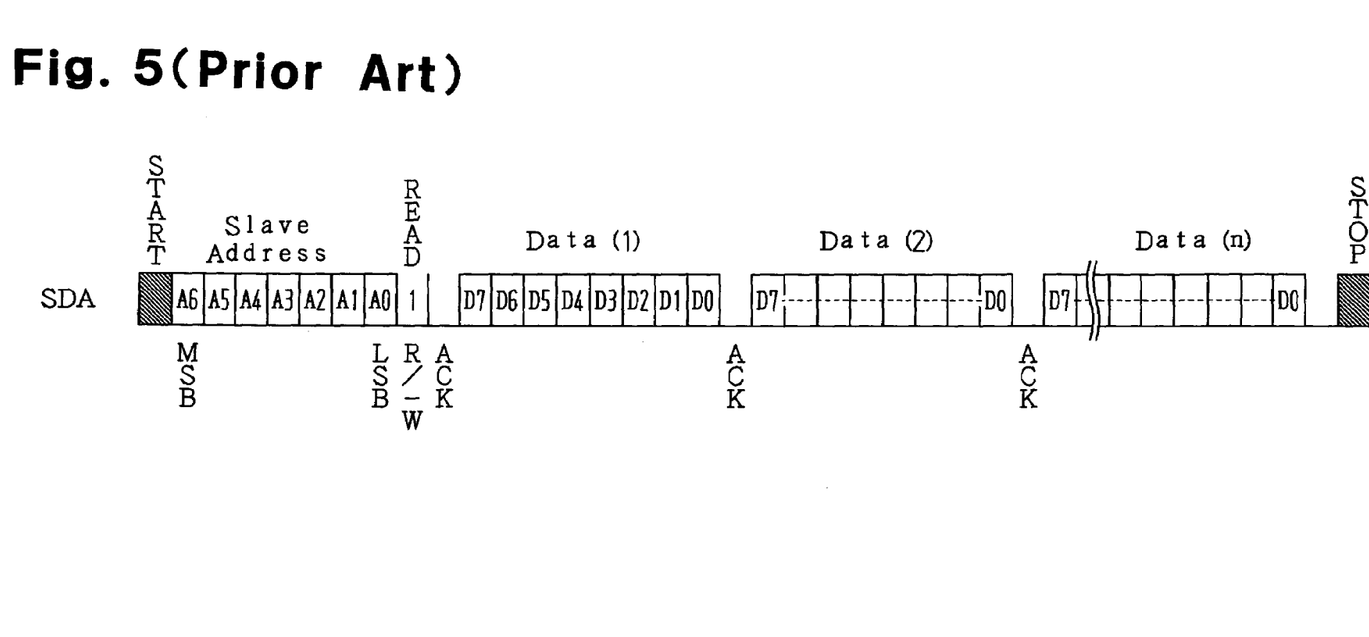
FIG. 5 shows a sequential read sequence of the I2C bus.

FIG. 5 shows a sequential read sequence in which a master device reads a plurality of data bytes from a slave device. First, the master device transmits a start condition. Subsequently, the master device transmits a slave address in seven clock cycles to select one of a plurality of slave devices from which data is to be read. The master device then transmits an H level read command code during the eighth clock cycle. The selected slave device outputs an acknowledgement when recognizing that it has been selected.

After outputting the acknowledgement, the slave device outputs 8-bit read data at the current address that it is holding. Subsequently, when the master device outputs an acknowledgement, the slave device outputs 8-bit read data for the next word address and the master device outputs an acknowledgement. Afterwards, the output of 8-bit read data from the slave device and the transmission of an acknowledgement from the master device are repeated continuously. When a memory address counter of the slave device reaches the last word address, the memory address counter rolls over to the top memory address. Finally, the master device transmits a stop condition without transmitting an acknowledgement. This terminates the sequential read operation of the plurality of data bytes from the slave device.

Figure 6:
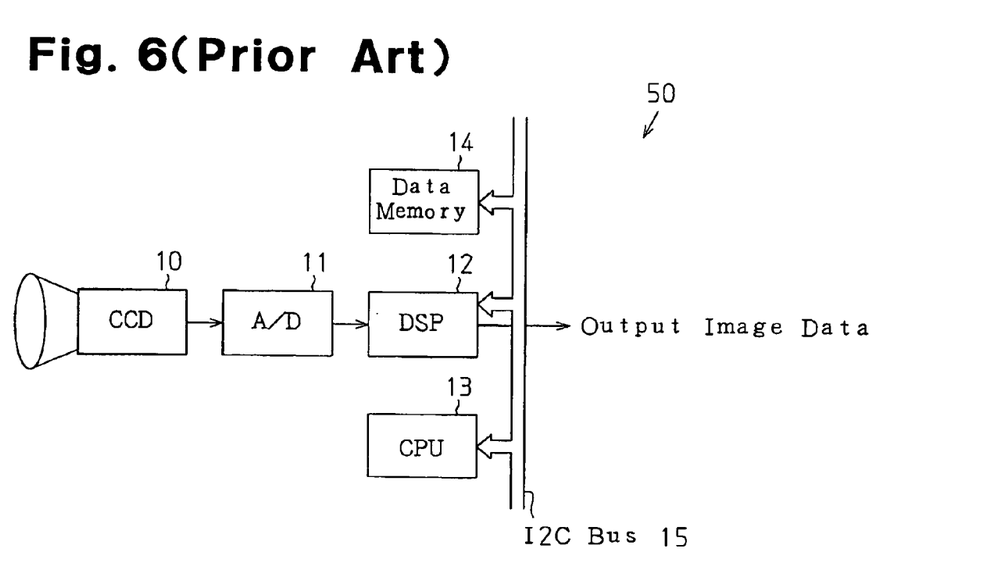
FIG. 6 is a block diagram showing an electronic module in the prior art.

In recent years, the application fields for modules incorporating a plurality of electronic components have widened. FIG. 6 is a block diagram showing a conventional CCD camera module 50. The module 50 includes a charge coupled device (CCD) 10, an analog-digital (A/D) converter circuit 11 for converting an analog image signal output from the CCD 10 into a digital signal, and a digital signal processor (DSP) 12 for processing a digital image signal output from the A/D converter circuit 11. The DSP 12 is connected to a CPU 13 and a data memory 14 via an I2C bus 15. The data memory 14 stores a DSP control program and camera adjustment data (including, for example, white balance properties of the CCD 10 and instrumental error correction data for the mechanical shutter).

In response to power activation or an operation start switch signal from the CCD 10, the CPU 13 operates as a master device. The CPU 13 reads out the DSP control program and camera adjustment data (e.g., white balance properties) from the data memory 14 functioning as a slave device, via the I2C bus 15. Subsequently, the CPU 13, operating as the master device, writes the DSP control program and the camera adjustment data in the DSP 12 functioning as the slave device, via the I2C bus 15. The DSP 12 thus implements predetermined image data processing or camera adjustment (e.g., white balance correction or instrumental error correction for the mechanical shutter).

Figure 7:
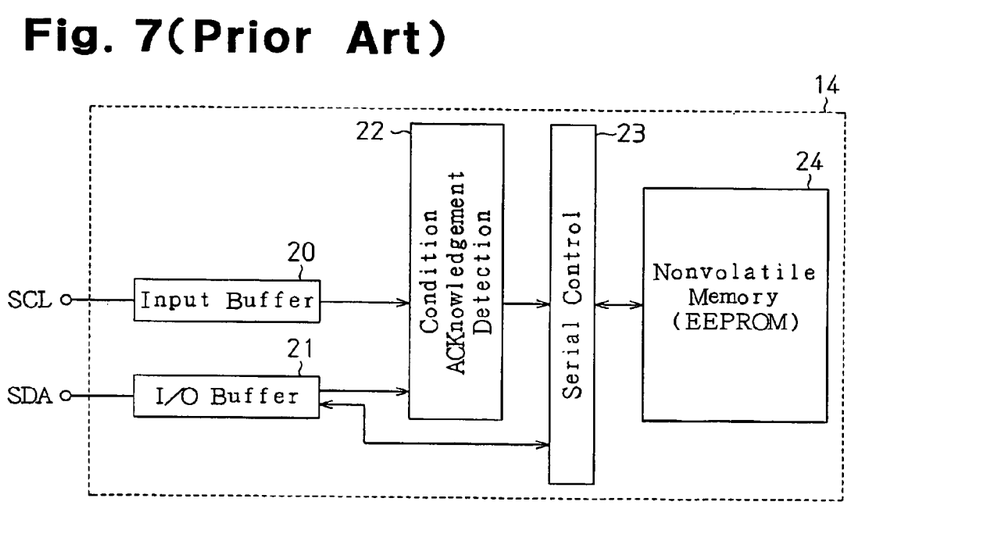
FIG. 7 is a block diagram showing a data memory in the prior art.

FIG. 7 is a block diagram showing the data memory 14 functioning as an I2C bus applicable slave device. An SCL terminal is an input terminal for receiving a serial clock signal and is connected to an input buffer 20. The SCL terminal performs signal processing at the rising and falling edges of the serial clock signal. An SDA terminal, which is used to perform bidirectional serial data transfer, is connected to an I/O buffer 21 including an input terminal and an open-drain output terminal. A condition-acknowledgement detection circuit 22 receives an output signal from the input buffer 20 and the I/O buffer 21 to detect a start or stop condition or an acknowledgement (ACK). A serial control circuit 23 receives a start/stop condition detection signal and an acknowledgement (ACK) detection signal, which are output from the condition-acknowledgement detection circuit 22, and an output signal from the I/O buffer 21. In accordance with the received signals, the serial control circuit 23 performs control to cause the I/O buffer 21 to output an acknowledgement, to write data in a nonvolatile memory 24, and to read data from the nonvolatile memory 24. When data is read from the nonvolatile memory 24, the serial control circuit 23 causes the I/O buffer 21 to output the read data.

A master device such as the CPU 13 is necessary in order to transfer data stored in the data memory 14 which functions only as a slave device. Therefore, with the data memory 14 of the prior art, the number of components configuring the module 50 cannot be decreased.

SUMMARY OF THE INVENTION

One aspect of the present invention is a data transfer memory for transferring data to a slave device via an I2C bus. The data transfer memory includes a nonvolatile memory for storing slave device information. A serial control circuit controls a write operation and a read operation of the nonvolatile memory. A master clock signal generator circuit generates a basic clock signal in accordance with a transfer start command. A master transfer sequencer circuit commands the serial control circuit to read data from the nonvolatile memory in synchronism with the basic clock signal.

Another aspect of the present invention electronic module includes an I2C bus. The electronic module includes a slave device connectable to the I2C bus. A data transfer memory transfers data to the slave device via the I2C bus. The data transfer memory includes a nonvolatile memory for storing slave device information. A serial control circuit controls a write operation and a read operation of the nonvolatile memory. A master clock signal generator circuit generates a basic clock signal in accordance with a transfer start command. A master transfer sequencer circuit commands the serial control circuit to read data from the nonvolatile memory in synchronism with the basic clock signal. The nonvolatile memory stores transfer data required for operation of the slave device in accordance with a predetermined format. The data transfer memory transfers the transfer data to the slave device in accordance with the transfer start command.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE PREFERRED EMBODIMENTS

Figure 8:
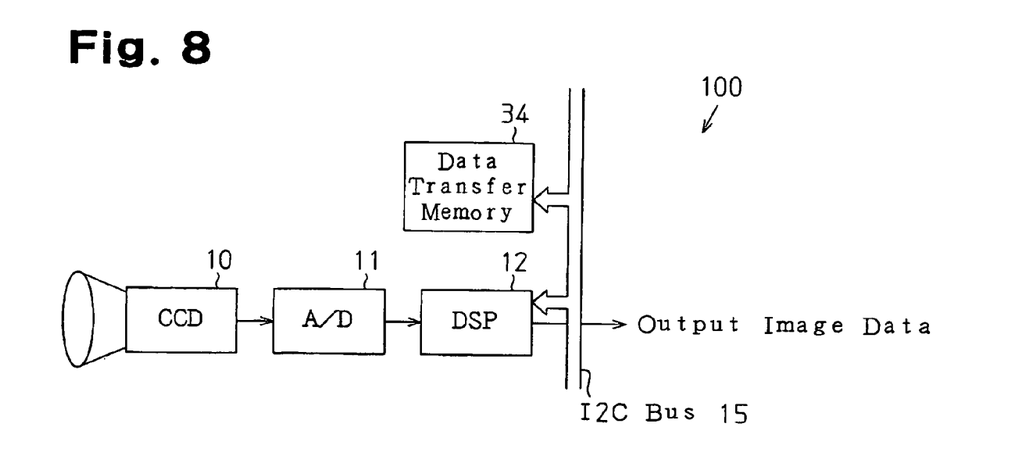
FIG. 8 is a block diagram showing an electronic module according to a preferred embodiment of the present invention.

FIG. 8 is a block diagram showing an electronic module 100, which is used for CCD cameras, according to a preferred embodiment of the present invention. The module 100 includes a CCD 10, an A/D converter circuit 11, and a DSP 12, which are identical to those of the prior art module 50 shown in FIG. 6. The module 100 of the preferred embodiment further includes a data transfer memory 34 connected to the I2C bus 15. The data transfer memory 34 stores a DSP control program and camera adjustment data (including, for example, white balance properties of the CCD 10 and instrumental error correction data for the mechanical shutter).

When activated or in response to an operation start switch signal from the CCD 10, the data transfer memory 34 operates as a master device and writes the DSP control program and camera adjustment data (e.g., white balance properties) in the DSP 12 serving as a slave device via the I2C bus 15. Thus, the DSP 12 executes predetermined image data processing and camera adjustment (e.g., white balance correction and instrumental error correction for the mechanical shutter).

Figure 9:
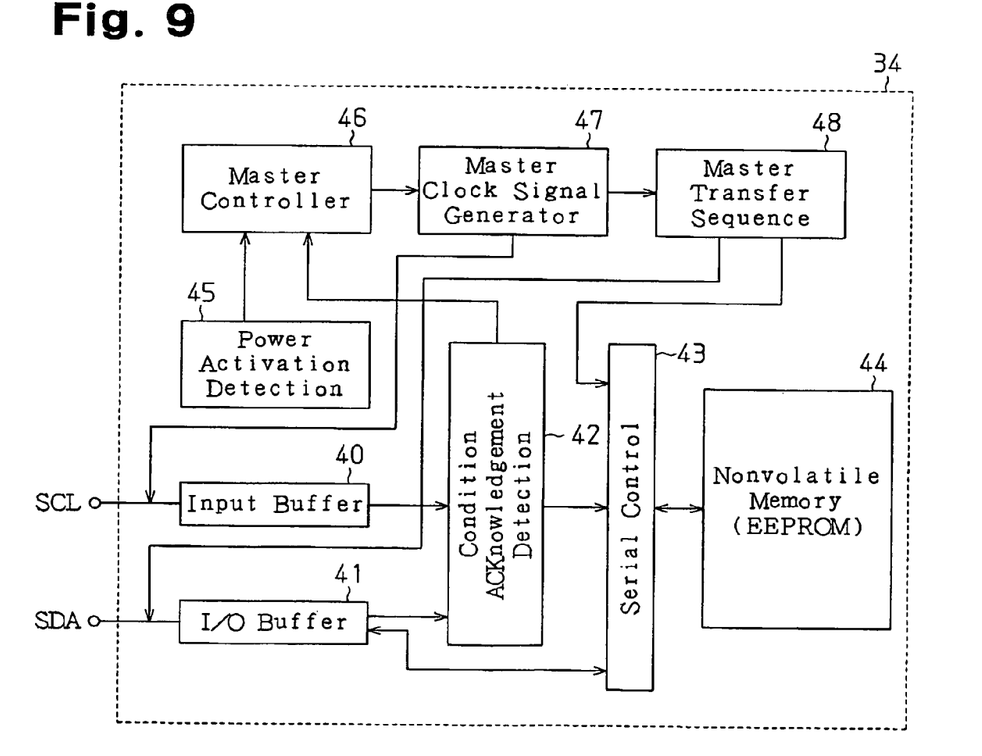
FIG. 9 is a block diagram showing a data transfer memory in the preferred embodiment.

FIG. 9 is a block diagram of the data transfer memory 34. An SCL terminal is an input terminal for receiving a serial clock signal and is connected to an input buffer 40. The SCL terminal performs signal processing in correspondence with the rising edge and the falling edge of the serial clock signal. An SDA terminal, which is used for bidirectional serial data transfer, is connected to an I/O buffer 41 including an input terminal and an open-drain output terminal. A condition-acknowledgement detection circuit 42 receives an output signal from the input buffer 40 and an output signal from the I/O buffer 41 to detect a start/stop condition and an acknowledgement (ACK). The serial control circuit 43 receives a start/stop condition detection signal and acknowledgement (ACK) detection signal output from the condition-acknowledgement detection circuit 42, and an output signal from the I/O buffer 41. In accordance with the received signals, the serial control circuit 43 performs control to cause the I/O buffer 41 to output an acknowledgement, to write data in a nonvolatile memory (EEPROM) 44, and to read data from the nonvolatile memory 44. When data is read from the nonvolatile memory 44, the serial control circuit 43 has the I/O buffer 41 output the read data.

The data transfer memory 34 includes a power activation detection circuit 45 for detecting power activation. The power activation detection circuit 45 is connected to a master controller circuit 46. When an activation detection signal is provided to the master controller circuit 46 by the power activation detection circuit 45, the master controller circuit 46 provides a transfer start command to a master clock signal generator circuit 47.

The master controller circuit 46 is also connected to the condition-acknowledgement detection circuit 42. When receiving a signal from the condition-acknowledgement detection circuit 42 indicating that no acknowledgement has been received from the slave device, the master controller circuit 46 also provides a transfer start command to the master clock signal generator circuit 47. In this case, the data transfer memory 34 performs the data transfer processing from the beginning again, in other words, executes a so-called retry.

When receiving a transfer start command, the master clock signal generator circuit 47 generates a basic clock signal and outputs the clock signal to the SCL line. Further, the clock signal generator circuit 47 commands the master transfer sequencer circuit 48 to execute a transfer sequence. The conventional data memory 14 (FIG. 7) has a clock signal generator circuit since timing control is also essential for writing data in the nonvolatile memory 24. In the preferred embodiment, the master clock signal generator circuit 47 includes a clock signal generator section for generating a basic clock signal in which major part of a prior art clock signal generator circuit is incorporated. When receiving a command for executing a transfer sequence from the master clock signal generator circuit 47, the master transfer sequencer circuit 48 shifts the SDA line from an H level to an L level when the SCL line is at an H level and transmits a start condition to the I2C bus 15. The master transfer sequencer circuit 48 then commands the serial control circuit 43 to read data stored in the nonvolatile memory 44. The serial control circuit 43 transmits the read data to the SDA line via the I/O buffer 41 synchronously with the basic clock signal. Further, the master transfer sequencer circuit 48 shifts the SDA line from an L level to an H level when the SCL line is at an H level and transmits a stop condition to the I2C bus 15.

Figure 10:
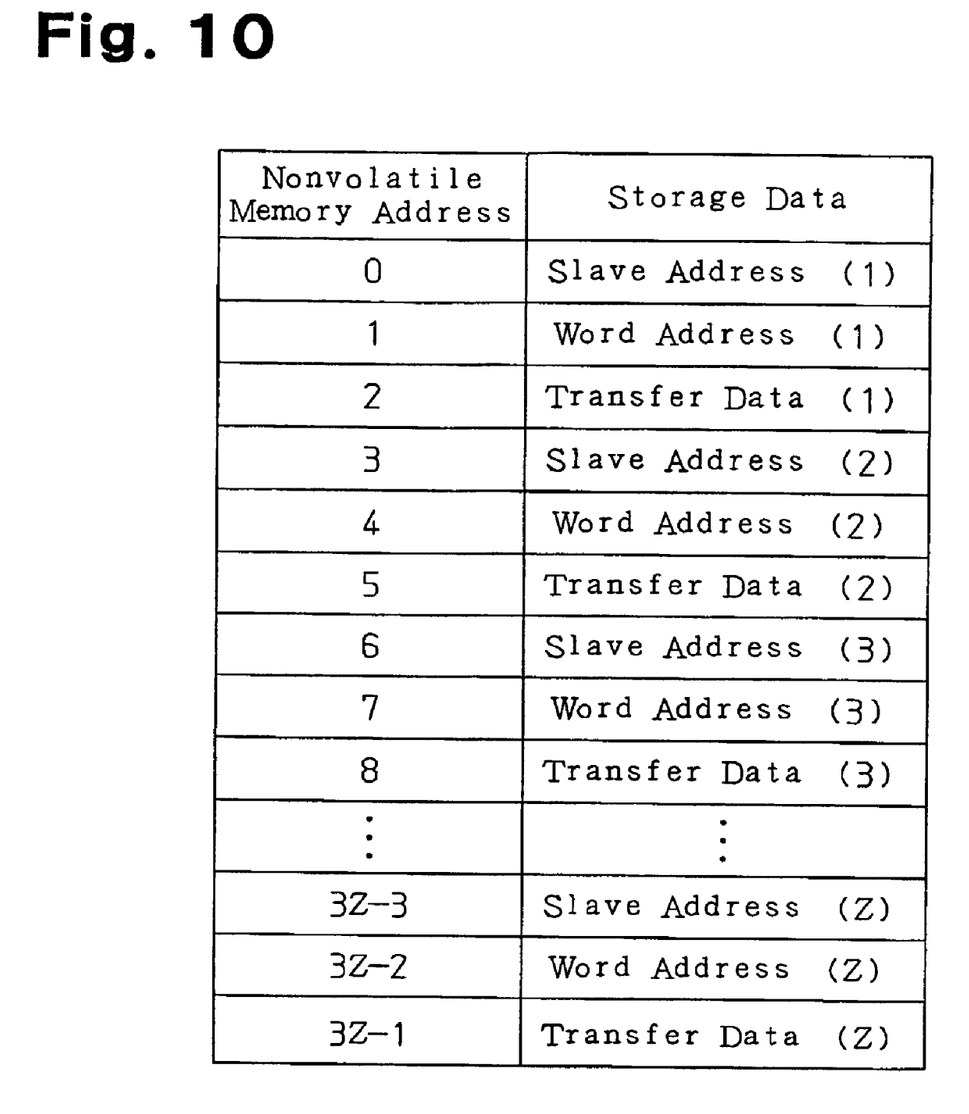
FIG. 10 shows an example of data stored in a nonvolatile memory of the data transfer memory.

FIG. 10 shows an example of data stored in the nonvolatile memory 44 in the preferred embodiment. The nonvolatile memory 44 stores 8 bits of data at each of its addresses. Three pieces of data, including a slave address to which a read-write command code is added, a word address, and transfer data, are respectively stored in three addresses. These three pieces of data configure one data block (basic unit). The three pieces of data are written to the data transfer memory 34, which serves as a slave device, by an external master device via the I2C bus 15. The slave address is configured by one bit of a write command code (an L level) added to seven bits of a slave address. The nonvolatile memory 44 thus stores slave addresses and word addresses as slave device information.

Figure 11:
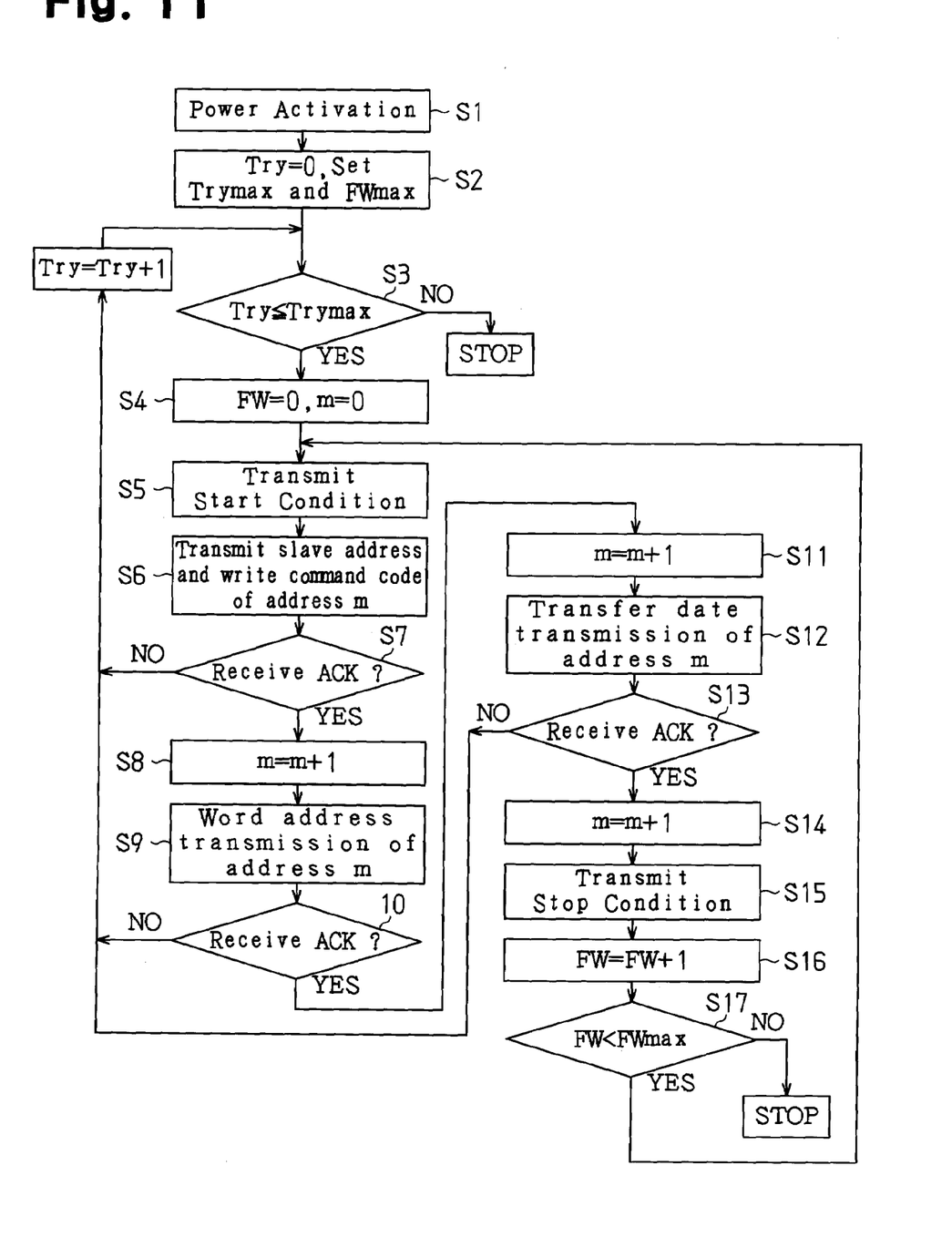
FIG. 11 is a flowchart showing a data transfer procedure for the electronic module in the preferred embodiment.

FIG. 11 is a flowchart showing a data transfer procedure (data forwarding procedure) for the module 100 in the preferred embodiment. The module 100 performs data transfer according to the byte write sequence of the I2C bus 15 as illustrated in FIG. 2. A case in which the nonvolatile memory 44 stores the data shown in FIG. 10 will now be described.

In step S1, when detecting power activation, the power activation detection circuit 45 provides an activation detection signal to the master controller circuit 46.

In step S2, the master controller circuit 46 initializes the retry number Try to the initial value 0 and sets a retry number upper limit Trymax and a transfer number upper limit FWmax. The transfer number upper limit FWmax is a value corresponding to 'Z' in FIG. 10, namely, the number of bytes of data to be transferred by the data transfer memory 34. The two upper limits Trymax and FWmax may be either fixed values preset by the master controller circuit 46 or fixed values stored in a specified area (e.g., in the final address) of the nonvolatile memory 44 or another nonvolatile memory (not shown). In this case, these fixed values are read by the master controller circuit 46.

In step S3, the master controller circuit 46 determines whether the retry number Try is less than or equal to the retry number upper limit Trymax. If the retry number Try is greater than the retry number upper limit Trymax, the data transfer is stopped.

If the retry number Try is less than or equal to the retry number upper limit Trymax, in step S4, the master controller circuit 46 initializes the transfer number FW to the initial value 0, and initializes the parameter m representing the address in the nonvolatile memory 44 to the initial value 0. These initial values are sent to the master transfer sequencer circuit 48, and the master controller circuit 46 provides a transfer start command to the master clock signal generator circuit 47.

In step S5, the master clock signal generator circuit 47 generates a basic clock signal, outputs the clock signal to the SCL line, and commands the master transfer sequencer circuit 48 to execute the transfer sequence. The master transfer sequencer circuit 48 shifts the SDA line from an H level to an L level when the SCL line is at an H level and transmits a start condition to the I2C bus 15.

In step S6, the master transfer sequencer circuit 48 commands the serial control circuit 43 to read the 8 bits of the slave address and write command code stored at the address corresponding to the address parameter m (e.g., 0) of the nonvolatile memory 44. The serial control circuit 43 transmits the read data one bit at a time to the SDA line via the I/O buffer 41 synchronously with the basic clock signal.

In step S7, the condition-acknowledgement detection circuit 42 detects whether the slave device outputs an acknowledgement synchronously with the next basic clock signal. If the acknowledgement is detected, step S8 is performed. If no acknowledgement is detected, step S18 is performed.

In step S8, the master controller circuit 46 adds 1 to the parameter m representing an address of the nonvolatile memory 44.

In step S9, the master transfer sequencer circuit 48 commands the serial control circuit 43 to read the 8 bits of the word address stored at the address corresponding to the address parameter m (e.g., 1) in the nonvolatile memory 44.

The serial control circuit 43 transmits the read data, one bit at a time, to the SDA line via the I/O buffer 41 synchronously with the basic clock signal.

In step S10, the condition-acknowledgement detection circuit 42 detects whether an acknowledgement is output by the slave device synchronously with the next basic clock signal. If the acknowledgement is detected, the processing proceeds to step S11. If the acknowledgement is not detected, the processing proceeds to step S18.

In step S11, 1 is added to the parameter m representing an address in the nonvolatile memory 44.

In step S12, the master transfer sequencer circuit 48 commands the serial control circuit 43 to read the 8 bits of the transfer data stored at the address corresponding to the address parameter m (e.g., 2) in the nonvolatile memory 44. The serial control circuit 43 transmits the read data, one bit at a time, to the SDA line through I/O buffer 41 synchronously with the basic clock signal.

In step S13, the condition-acknowledgement detection circuit 42 detects whether an acknowledgement is output by the slave device synchronously with the next basic clock signal. If the acknowledgement is detected, step S14 is performed. If the acknowledgement is not detected, step S18 is performed.

In step S14, the master controller circuit 46 adds 1 to the parameter m representing an address of the nonvolatile memory 44.

In step S15, the master transfer sequencer circuit 48 shifts the SDA line from an L level to an H level when the SCL line is at an H level and transmits a stop condition to the I2C bus 15.

In step S17, the master controller circuit 46 determines whether the transfer number FW is less than the transfer number upper limit FWmax. If the transfer number FW is less than the transfer number upper limit FWmax, in step S5, the data transfer memory 34 successively transfers the transfer data to the slave device via the I2C bus 15 according to the address parameter m to which 1 has been added. Each data transfer is performed in a basic unit including three pieces of data, namely, the slave address to which the write command code is added, the word address, and the transfer data. If the transfer number FW is greater than or equal to the transfer number upper limit FWmax, this would indicate that all of the transfer data has been transferred to the slave device. In this case, the data transfer memory 34 terminates the data transfer.

If no acknowledgement is detected either in step S7 or in S10, the master controller circuit 46 adds 1 to the retry number Try in step S18 and proceeds to step S3. In step S3, the master controller circuit 46 determines whether the retry number Try is less than or equal to the retry number upper limit Trymax. If the retry number Try is less than or equal to the retry number upper limit Trymax, the data transfer is performed again from the beginning. Otherwise, the data transfer is stopped.

Figure 12:
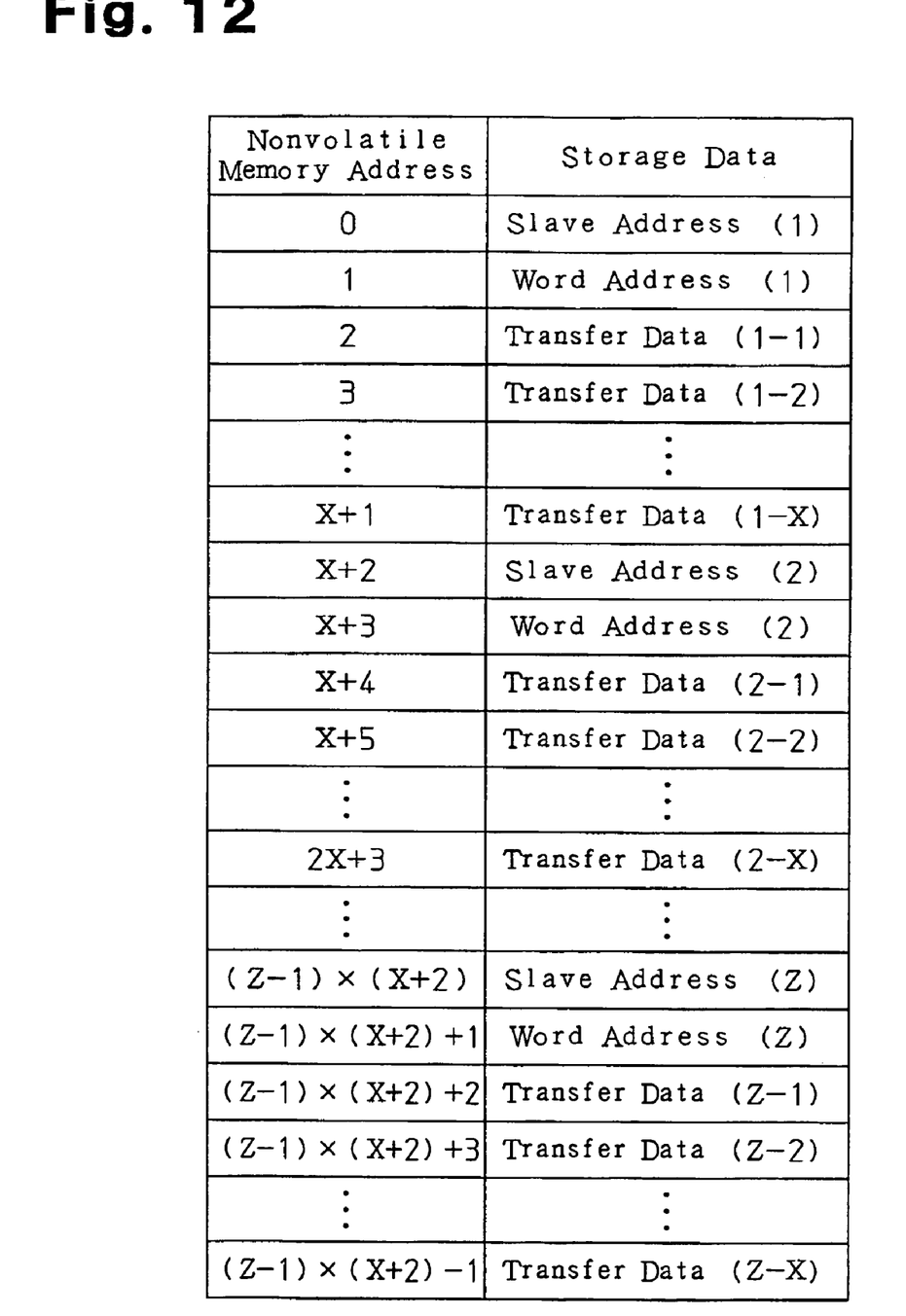
FIG. 12 shows another example of data stored in the nonvolatile memory of the data transfer memory according to the present invention.

FIG. 12 shows an example of data stored in the nonvolatile memory 44 of the preferred embodiment. The nonvolatile memory 44 stores 8 bits of data at each address. Further, (X+2) pieces of data, including a slave address to which a read-write command code is added, a word address, and X bytes of transfer data are stored at an (X+2) number of addresses, respectively. The (X+2) pieces of data configure one data block (basic unit). The (X+2) pieces of data are written by an external master device to the data transfer memory 34, which serves as a slave device, via the I2C bus 15. The read-write command code added to the slave address is a write command code (L level). The data transfer memory 34 performs data transfer according to the page write sequence of the I2C bus 15 as shown in FIG. 4 in a manner that is basically the same as that of FIG. 11. However, the transfer number FW represents a value corresponding to Z in FIG. 12, that is, the number of pages of transfer data transferred by the data transfer memory 34. The transfer number upper limit FWmax represents the upper limit of the transfer number FW. Following step S11, step S12 to step S14 are repeated X times.

As described above, the data transfer memory of the present invention functions as a master device. This eliminates the need for an external device that functions as a master device, such as a CPU, for transferring transfer data stored in the data transfer memory to other devices. Therefore, the number of components configuring the module 100 may be decreased. Additionally, the DSP control program and camera adjustment data may be transferred to the DSP (initialization) by the module 100 alone using power activation or the like as a trigger. In the prior art, timing control is essential for writing data in a nonvolatile memory. Thus, the prior art volatile memory includes a clock signal generator circuit. In the data transfer memory of the present invention, the master clock signal generator circuit 47 incorporates a circuit for generating a basic clock signal by using most of the prior art clock signal generator circuit. This prevents the circuit scale and chip size from being enlarged.

In the preferred embodiment, a transfer start command is issued when the power activation detection circuit 45 detects power activation. However, the present invention is not limited to such configuration, and the transfer start command may be issued in response to a command from an external device. In this case, the power activation detection circuit 45 may be omitted.

In the preferred embodiment, as shown in FIG. 10 or FIG. 12, data is stored in the nonvolatile memory 44 in a state where the slave address can be changed for each basic data unit. However, it is of course possible to use the same slave address.

When the slave address of the slave device to which the data transfer memory transfers data is predetermined, the master transfer sequencer circuit 48 is not required to read the slave address from the nonvolatile memory 44 each time to output the slave address to the SDA terminal. For example, the master transfer sequencer circuit 48 may read the slave address from the nonvolatile memory 44 or another nonvolatile memory to store the slave address in a register, and then output the stored slave address to the SDA terminal every time.

When the increment amount of the word address of the slave device to which the data transfer memory transfers data is predetermined, the master transfer sequencer circuit 48 is not required to read the word address from the nonvolatile memory 44 each time to output the word address to the SDA terminal. The transfer sequencer circuit 48 may update the word address by adding an increment amount (e.g., +1) each time and output the updated word address directly to the SDA terminal.

In such an arrangement, the data stored in the memory area of the nonvolatile memory 44 may be limited to only transfer data. This enables the memory area to be used efficiently.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A data transfer memory for transferring data to a slave device via an I2C bus, the data transfer memory comprising:
   a nonvolatile memory for storing slave device information;
   a serial control circuit for controlling a write operation and a read operation of the nonvolatile memory;
   a master clock signal generator circuit for generating a basic clock signal in accordance with a transfer start command; and
   a master transfer sequencer circuit for commanding the serial control circuit to read data from the nonvolatile memory in synchronism with the basic clock signal.

2. The data transfer memory according to claim 1, further comprising:
   a power activation detection circuit for detecting power activation, wherein the transfer start command is provided to the master clock signal generator circuit when the power activation detection circuit detects power activation.

3. The data transfer memory according to claim 2, wherein the nonvolatile memory stores transfer data that is transferred to the slave device in accordance with a predetermined format.

4. The data transfer memory according to claim 2, further comprising:
   a master controller circuit connected to the power activation detection circuit and the master clock signal generator circuit, wherein the master controller circuit provides the transfer start command to the master clock signal generator circuit in response to power activation detection by the power activation detection circuit.

5. An electronic module including an I2C bus, the electronic module comprising:
   a slave device connectable to the I2C bus; and
   a data transfer memory for transferring data to the slave device via the I2C bus, the data transfer memory including:
   a nonvolatile memory for storing slave device information;
   a serial control circuit for controlling a write operation and a read operation of the nonvolatile memory;
   a master clock signal generator circuit for generating a basic clock signal in accordance with a transfer start command; and
   a master transfer sequencer circuit for commanding the serial control circuit to read data from the nonvolatile memory in synchronism with the basic clock signal;
   wherein the nonvolatile memory stores transfer data required for operation of the slave device in accordance with a predetermined format; and
   the data transfer memory transfers the transfer data to the slave device in accordance with the transfer start command.

6. The electronic module according to claim 5, wherein the data transfer memory further includes:
   a power activation detection circuit for detecting power activation, the transfer start command being provided to the master clock signal generator circuit when the power activation detection circuit detects power activation, the data transfer memory transferring the transfer data to the slave device in response to power activation.

7. The electronic module according to claim 6, wherein the data transfer memory further includes:
   a master controller circuit connected to the power activation detection circuit and the master clock signal generator circuit, the master controller circuit providing the transfer start command to the master clock signal generator circuit in response to power activation detection by the power activation detection circuit.

* * * * *